United States Patent
Lendvay

(10) Patent No.: US 11,698,870 B2
(45) Date of Patent: Jul. 11, 2023

(54) MEMORY MODULE DATA BUFFER

(71) Applicant: Micron Technology, Inc., Boise, ID (US)

(72) Inventor: William A. Lendvay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/162,962

(22) Filed: Jan. 29, 2021

(65) Prior Publication Data

US 2022/0206965 A1   Jun. 30, 2022

Related U.S. Application Data

(60) Provisional application No. 63/132,818, filed on Dec. 31, 2020.

(51) Int. Cl.
  *G06F 13/16*   (2006.01)
  *G06F 13/42*   (2006.01)
  *G11C 11/00*   (2006.01)

(52) U.S. Cl.
  CPC ...... *G06F 13/1668* (2013.01); *G06F 13/4282* (2013.01); *G11C 11/005* (2013.01)

(58) Field of Classification Search
  CPC ............ G06F 13/1668; G06F 13/4282; G11C 11/005
  See application file for complete search history.

(56) References Cited

U.S. PATENT DOCUMENTS

| | | | |
|---|---|---|---|
| 2008/0005496 A1* | 1/2008 | Dreps | G06F 13/1684 711/154 |
| 2014/0101382 A1* | 4/2014 | Kaviani | G11C 5/04 711/105 |
| 2015/0106560 A1* | 4/2015 | Perego | G06F 12/0246 711/105 |
| 2017/0075576 A1* | 3/2017 | Cho | G11C 11/005 |
| 2017/0109058 A1* | 4/2017 | Shallal | G06F 11/1441 |
| 2018/0285013 A1* | 10/2018 | Rajan | G06F 3/0656 |
| 2019/0340314 A1 | 11/2019 | Boesch et al. | |
| 2019/0371400 A1* | 12/2019 | Farmahini Farahani | G11C 14/0018 |
| 2020/0036644 A1 | 1/2020 | Belogolovy et al. | |
| 2020/0183583 A1 | 6/2020 | Kachare et al. | |
| 2020/0265876 A1 | 8/2020 | Takefman et al. | |
| 2020/0293461 A1* | 9/2020 | Yeung | G11C 5/04 |
| 2020/0371970 A1 | 11/2020 | Chachad et al. | |
| 2020/0402551 A1* | 12/2020 | Lim | G06F 13/1694 |

* cited by examiner

*Primary Examiner* — Henry Tsai
*Assistant Examiner* — Harry Z Wang
(74) *Attorney, Agent, or Firm* — Brooks, Cameron & Huebsch, PLLC

(57) ABSTRACT

The present disclosure includes apparatuses and methods related to a data buffer in a non-volatile dual in-line memory module (NVDIMM). An example apparatus can include a data buffer couplable to a host, a first memory device (e.g., volatile memory), wherein the first memory device is coupled to the data buffer via a first bus, a second memory device (e.g., non-volatile memory), and a controller, wherein the controller is coupled to the data buffer via a second bus and wherein the controller is configured to cause a data transfer from first memory device to the second memory device via the data buffer and the second bus.

18 Claims, 4 Drawing Sheets

MEMORY MODULE DATA BUFFER

PRIORITY INFORMATION

This application is a Non-Provisional Application of U.S. Provisional Application 63/132,818, filed Dec. 31, 2020, the contents of which are herein incorporated by reference.

TECHNICAL FIELD

The present disclosure relates generally to memory devices, and more particularly, to apparatuses and methods for a data buffer in a memory module.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be uses as main memory in computing systems.

DETAILED DESCRIPTION

Figure 1:
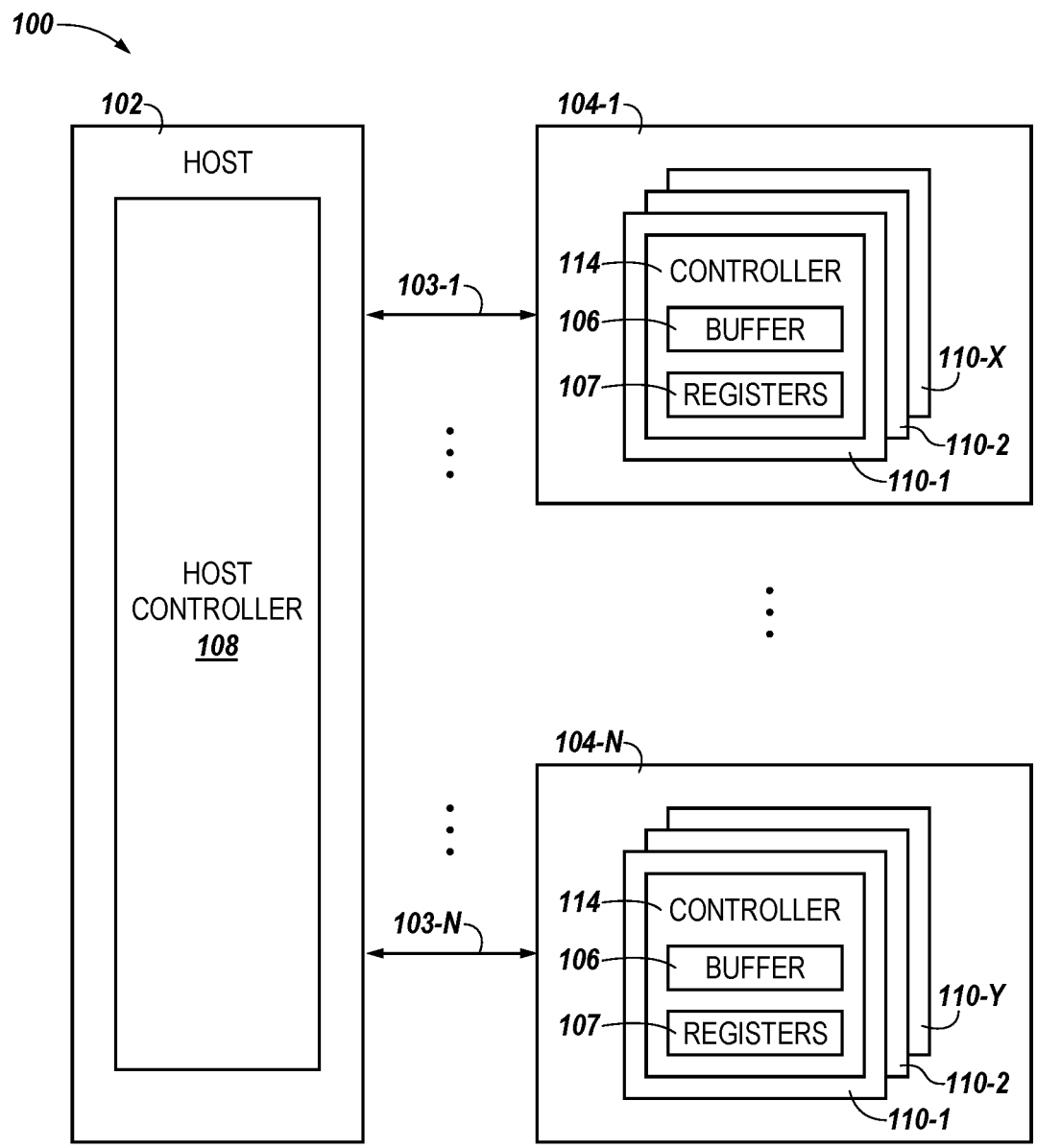
FIG. 1 is a block diagram of an apparatus in the form of a computing system including a memory system in accordance with a number of embodiments of the present disclosure.

The present disclosure includes apparatuses and methods related to a data buffer in memory module. For example, the memory module could be a dual in line memory module (DIMM) and/or a non-volatile DIMM (NVDIMM). An example apparatus can include a data buffer couplable to a host, a first memory device (e.g., volatile memory), wherein the first memory device is coupled to the data buffer via a first bus, a second memory device (e.g., non-volatile memory), and a controller, wherein the controller is coupled to the data buffer via a second bus and wherein the controller is configured to cause a data transfer from first memory device to the second memory device via the data buffer and the second bus.

A memory system can include a dual in-line memory module (DIMM) having a number of memory devices. For example, a DIMM can be a non-volatile DIMM (NVDIMM) that includes a number of volatile memory devices and a number of non-volatile memory devices. The number of non-volatile memory devices can be a backing store for the volatile memory devices. For example, the non-volatile memory devices can be configured to store the data from the volatile memory devices during a catastrophic save operation. A catastrophic save operation can save data from volatile memory devices to non-volatile memory devices in response to a power loss on the DIMM. A restore operation, upon power up of the DIMM, can save data from the non-volatile memory devices to the volatile memory devices.

In a number of embodiments, an NVDIMM can include a number of data buffers for data transfers between a host and the number of volatile memory devices and/or for data transfers between the number of volatile memory devices and the number of non-volatile memory devices. The data buffer can be can include static random access memory (SRAM), SDRAM, and/or DRAM memory arrays. The data buffer can be coupled to the number of volatile memory devices such that all of the DQ pins of the number of volatile memory devices are coupled to the data buffer, therefore the number of volatile memory devices can have any type of input/output configuration (e.g., x4, x8, and/or x16, among others, for example) and/or any number of ranks. The data buffer can be coupled to the controller via a sideband bus. The data buffer can receive data from the number of volatile memory devices and the data buffer can transfer data serially on the sideband bus to the controller. The sideband bus can operate by transferring data serially at a speed that allows the volatile memory to operate at full speed (e.g., the buffer can transfer data on the sideband bus such that the volatile memory can operate at full speed without being slowed due to any latency associated with buffer and/or the non-volatile memory). Data transfers from the number of volatile memory devices to the number of non-volatile memory device can be done using the data buffer, therefore the number volatile memory devices do not include DQ pins that are reserved for data transfers to the controller and/or the number of non-volatile memory devices. Also, data transfers from the number of volatile memory devices to the number of non-volatile memory device can use the sideband bus coupled to the data buffer, which can reduce the number of signals needed for the data transfer when compared to transferring data on DQ pins of the number of volatile memory devices coupled directly to the controller. The sideband bus that couples the data buffer to the controller can transfer data in a single routing layer and can transfer data in one or two lanes, for example. Back up operations that transfer data from the number of volatile memory devices to the number of non-volatile memory device can include transferring the data from the number of volatile memory devices to the data buffer without latency associated with transferring data from volatile memory to a memory with slower access speeds.

The NVDIMM can receive commands from another device, such as a host, to transfer data and/or the NVDIMM can generate commands, by a controller on the NVDIMM, to transfer data. The commands received from another device can include requests to transfer data between a host and the number of volatile memory devices. The commands to transfer data between a host and the number of volatile memory devices can be executed by transferring data via the data buffer coupled to the host. The data buffer can include a multiplexor that selects a data bus coupled to the host for the data transfer. The data buffer can be an active driver of the DQ/DQS I/O on the volatile memory, so the data buffer does not affect bandwidth limitations on the host.

The commands generated by the controller of the NVDIMM can include requests to transfer data between the number of volatile memory devices and the number of non-volatile memory devices. The commands to transfer data between a host and the number of volatile memory devices can be executed by transferring data via the data buffer coupled to the controller, which is coupled to the number of non-volatile memory devices. The data buffer can include a multiplexor that selects a data bus (e.g., sideband bus) coupled to the controller for the data transfer.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, memory systems 104-1 . . . 104-N can include a one or more dual in-line memory modules (DIMM) 110-1, . . . , 110-X, 110-Y. The DIMMs 110-1, . . . , 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module. The examples described below in association with FIGS. 1-4 use a DIMM as the memory module, but the embodiments of the present disclosure can be used on any memory systems that include volatile and/or non-volatile memory. In FIG. 1 memory system 104-1 is coupled to the host via channel 103-1 can include DIMMs 110-1, . . . , 110-X, where DIMMs 110-1, . . . , 110-X are NVDIMMs. In this example, each DIMM 110-1, . . . , 110-X, 110-Y includes a controller 114. Controller 114 can generate commands and/or receive commands from host 102 and control execution of the commands on a DIMM. Also, in a number of embodiments, the protocol of the present disclosure could be implemented by a memory device (e.g., a DIMM) without a controller and execution of the commands using the protocol of the present disclosure could be built into the memory device. The host 102 can send commands to the DIMMs 110-1, . . . , 110-X, 110-Y using the protocol of the present disclosure and/or a prior protocol, depending on the type of memory in the DIMM. For example, the host can use the protocol of the present disclosure to communicate on the same channel (e.g., channel 103-1) with a NVDIMM and a prior protocol to communicate with a DRAM DIMM that are both on the same memory system 104.

As illustrated in FIG. 1, a host 102 can be coupled to the memory systems 104-1 . . . 104-N. In a number of embodiments, each memory system 104-1 . . . 104-N can be coupled to host 102 via a channel (e.g., channels 103-1, . . . , 103-N). In FIG. 1, memory system 104-1 is coupled to host 102 via channel 103-1 and memory system 104-N is coupled to host 102 via channel 103-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the DIMMs 110-1, . . . , 110-X, 110-Y via channels 103-1 . . . 103-N. The host controller 108 can communicate with the DIMMs 110-1, . . . , 110-X, 110-Y and/or the controller 114 on each of the DIMMs 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between 102 and DIMMs 110-1, . . . , 110-X, 110-Y on a number of buses, such as a data bus and/or an address bus, for example, via channels 103-1 . . . 103-N.

The host controller 108 and/or controller 114 on a DIMM can include control circuitry, e.g., hardware, firmware, and/or software. In one or more embodiments, the host controller 108 and/or controller 114 can be an application specific integrated circuit (ASIC) and/or a field programmable gate array (FPGA) coupled to a printed circuit board including a physical interface. Also, each controller 114 of DIMMs 110-1, ..., 110-X, 110-Y can include buffer 106 of volatile and/or non-volatile memory and registers 107. Buffer 106 can be used to buffer data that is used during execution of commands.

The DIMMs 110-1, ..., 110-X, 110-Y can provide main memory for the memory system or could be used as additional memory or storage throughout the memory system. Each DIMM 110-1, ..., 110-X, 110-Y can include one or more arrays of memory cells on memory dies, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1 can include additional circuitry that is not illustrated so as not to obscure embodiments of the present disclosure. For example, the memory systems 104-1 ... 104-N can include address circuitry to latch address signals provided over I/O connections through I/O circuitry. Address signals can be received and decoded by a row decoder and a column decoder to access the DIMMs 110-1, ..., 110-X, 110-Y. It will be appreciated by those skilled in the art that the number of address input connections can depend on the density and architecture of the DIMMs 110-1, ..., 110-X, 110-Y.

Figure 2:
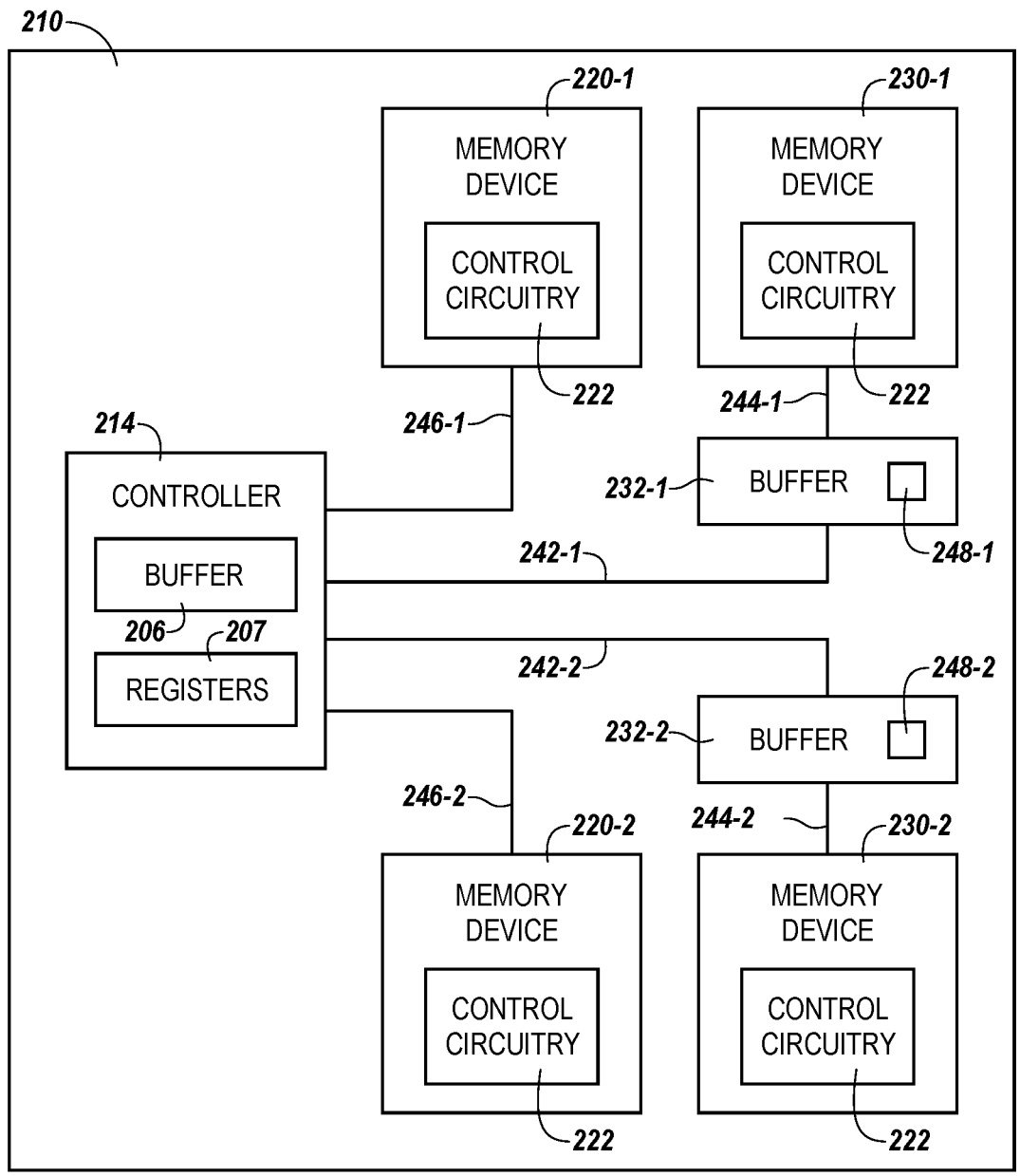
FIG. 2 is a block diagram of an apparatus in the form of a dual in-line memory modules (DIMM) in accordance with a number of embodiments of the present disclosure.

FIG. 2 is a block diagram of an apparatus in the form of a dual in-line memory modules (DIMM) 210 in accordance with a number of embodiments of the present disclosure. In FIG. 2, DIMM 210 can include controller 214. Controller 214 can include memory, such as SRAM memory, that can be a buffer 206 and/or a number of registers 207. DIMM 210 includes memory devices 220-1 and 220-2 coupled to the controller via buses 246-1 and 246-2, respectively. DIMM 210 includes buffers 232-1 and 232-2 coupled to controller 214 via buses 242-1 and 242-2, respectively. DIMM 210 includes memory device 230-1 and 230-2 coupled to buffers 232-1 and 232-2 via buses 244-1 and 244-2, respectively. Memory devices 230-1 and 230-2 can be volatile memory. Memory devices 220-1 and 220-2 can be non-volatile memory devices, which can be a backing store for memory devices 230-1 and 230-2. Memory devices 220-1, 220-2, 230-1, and 230-2 and buffers 232-1 and 232-2 include control circuitry 222 (e.g., hardware, firmware, and/or software) which can be used to execute commands on the memory devices 220-1, 220-2, 230-1, and 230-2 and buffers 232-1 and 232-2. The control circuitry 222 can receive commands from controller 214. The control circuitry 222 can be configured to execute commands to read and/or write data in the memory devices 220-1, 220-2, 230-1, and 230-2 and buffers 232-1 and 232-2.

Buffers 232-1 and 232-2 can be configured to transfer data between memory devices 230-1 and 230-2 and another device (not shown), such as a host. For example, buffers 232-1 and 232-2 can receive data from a host on a bus (not shown) and transfer the data to memory devices 230-1 and 230-1 via buses 244-1 and 244-2, respectively. Buffers 232-1 and 232-2 can include multiplexors 248-1 and 248-2 to select a bus (not shown) to transfer data between the buffers 232-1 and 232-2 and another device (not shown). Buffers 232-1 and 232-2 can receive data from memory devices 230-1 and 230-1 via buses 244-1 and 244-2, respectively, and transfer the data to a host on a bus (not shown).

Buffers 232-1 and 232-2 can be configured to transfer data between memory devices 230-1 and 230-1 and memory devices 220-1 and 220-2. For example, buffers 232-1 and 232-2 can receive data from memory devices 230-1 and 230-1 via buses 244-1 and 244-2, respectively, and transfer the data to controller 214 via buses 242-1 and 242-2, respectively. Controller 214 can then transfer the data to memory devices 220-1 and 220-2 via buses 246-1 and 246-2, respectively. Buses 242-1 and 242-2 can be sideband buses that are configured to serially transfer data. Buses 242-1 and 242-2 can operate by transferring data serially at a speed that allows the memory device 230-1 and 230-2 to operate at full speed (e.g., the buffer can transfer data on the buses 242-1 and 242-2 such that the memory devices 230-1 and 230-2 can operate at full speed without being slowed due to any latency associated with buffers 232-1 and 232-2, controller 214 and/or the memory devices 220-1 and 220-2). Buffers 232-1 and 232-2 can include multiplexors 248-1 and 248-2 to select a buses 242-1 and 242-2 to transfer data between the buffers 232-1 and 232-2 and controller 214 and/or memory devices 220-1 and 220-2.

Buffers 232-1 and 232-2 can be configured to transfer data from a host and memory devices 220-1 and 220-2. For example, buffers 232-1 and 232-2 can receive data from a host (via a bus, not shown) and transfer the data to controller 214 via buses 242-1 and 242-2, respectively. Controller 214 can then transfer the data to memory devices 220-1 and 220-2 via buses 246-1 and 246-2, respectively. Buses 242-1 and 242-2 can be sideband buses that are configured to serially transfer data.

Figure 3:
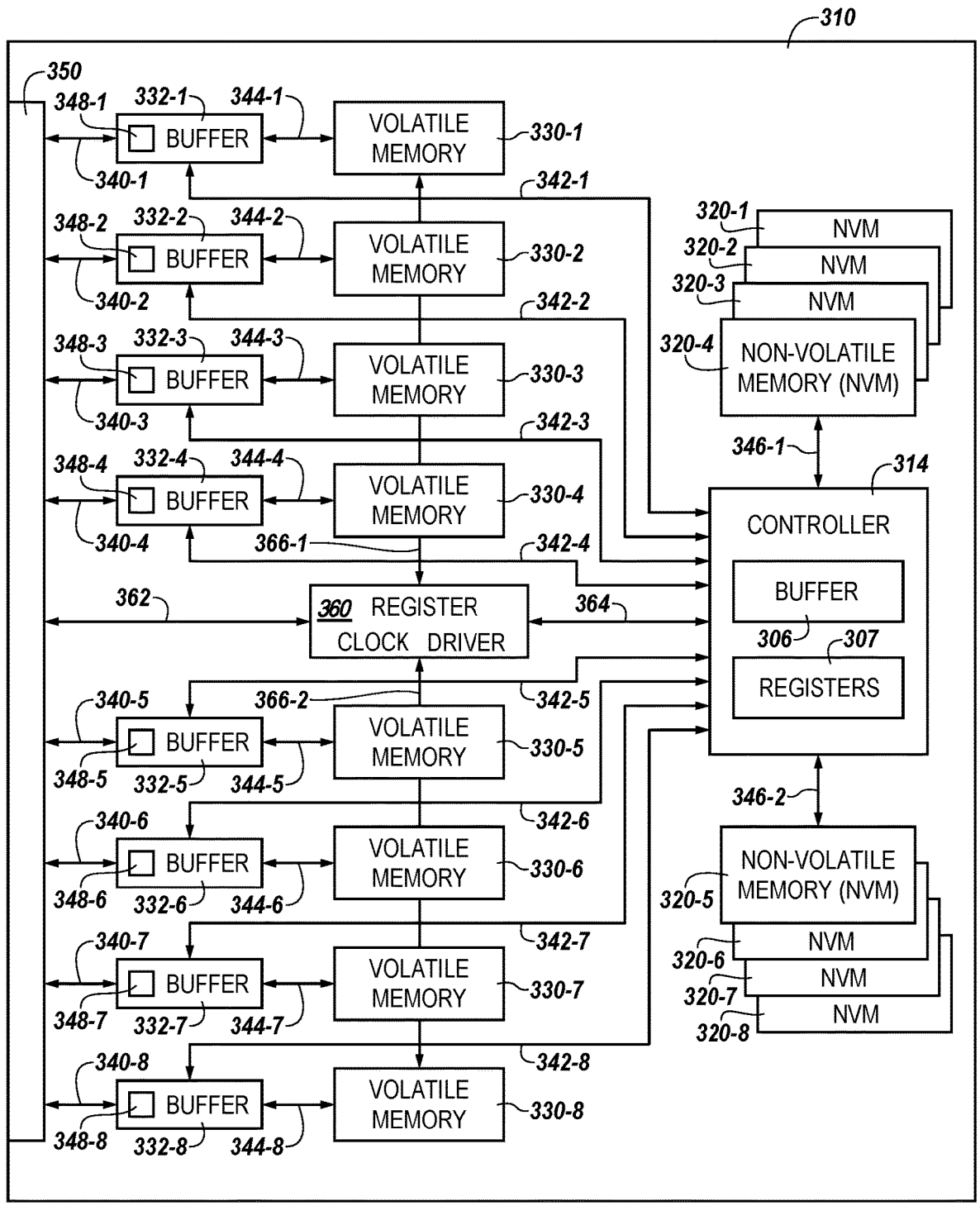
FIG. 3 is a block diagram of a memory system comprising a dual in-line memory module (DIMM) in accordance with a number of embodiments of the present disclosure.

FIG. 3 is a block diagram of a memory system comprising a dual in-line memory module (DIMM) 310 in accordance with a number of embodiments of the present disclosure. In FIG. 3, DIMM 310 includes an edge connector 350 coupled to data buses 340-1, ..., 340-8 and command/address buses 362. A host can be coupled to edge connector 350 of DIMM 310 via a number of channels (e.g., channels 103-1, ..., 103-N in FIG. 1). For example, a host can be coupled to DIMM 310 via a first channel that includes data buses 340-1, ..., 340-4 and a second channel that includes data buses 340-5 and 340-8. A host can send commands on a first channel for execution on memory devices 330-1, ..., 330-4 and can send commands on the second channel for execution on memory devices 330-5, ..., 330-8, for example. Controller 314 can receive commands from a host. The commands from a host can be sent to register clock driver (RCD) 360 via bus 362 and the commands can be sent from RCD 360 to controller 314 via bus 364. The controller 314 can receive the commands from RCD 360 and store data associated with the commands (e.g., command instructions and/or data read from and/or to be written to memory devices 320 and/or 330 during execution of the commands) in buffer 306. Controller 314 can send a signal to RCD 360 on bus 364 indicating which memory device of memory devices 330-1, ..., 330-8 will execute the command. The signal can be sent from RCD 360 on buses 366-1 and 366-2 to the memory device of memory devices 330-1, ..., 330-8 that will execute the command. For example, if the command is transferring data between memory device 330-1 to a host, the signal can indicate to multiplexor 348-1 to couple bus 340-1 to buffer 332-1. The command can be executed by transferring data between the host and buffer 332-1 on bus 340-1 and between buffer 332-1 and memory device 330-1 on bus 344-1. Memory devices 330-1, ..., 330-8 can send signals, (e.g., command completion signals) on buses 366-1 and 366-2 to RCD 360 and controller 314 that indicate memory devices 330-1, ..., 330-8 have completed execution of commands and are ready for additional commands. Once a command has been executed, controller 314 can send another command to RCD 360 for execution and/or a status signal to the host indicating that the command received from host has been executed. Controller 314 can include non-volatile and/or volatile memory, such as SRAM memory, that can be a buffer 306 and/or a register 307 used during execution of commands.

DIMM 310 can include a first number of memory devices 330-1, . . . , 330-8. For example, memory devices 330-1, . . . , 330-8 can be DRAM memory devices, among other types of volatile and/or non-volatile memory. Each of the memory devices 330-1, . . . , 330-8 can be paired with a buffer 332-1, . . . , 332-8, where memory device 330-1 is paired with buffer 332-1 via bus 344-1, memory device 330-2 is paired with buffer 332-2 via bus 344-2, memory device 330-3 is paired with buffer 332-3 via bus 344-3, memory device 330-4 is paired with buffer 332-4 via bus 344-4, memory device 330-5 is paired with buffer 332-5 via bus 344-5, memory device 330-6 is paired with buffer 332-6 via bus 344-6, memory device 330-7 is paired with buffer 332-7 via bus 344-7, and memory device 330-8 is paired with buffer 332-8 via bus 344-8. Buffers 332-1, . . . , 332-8 can be configured to buffer data that is transferred between a host and memory devices 330-1, . . . , 330-8.

Memory devices 330-1, . . . , 330-8 can be paired with buffers 332-1, . . . , 332-8 for transferring data to a host and/or to memory devices 320-1, . . . , 320-8. Buffers 332-1, . . . , 332-8 can include multiplexors 348-1, . . . , 348-2 that can select buses 340-1, . . . , 340-8 when transferring data to/from a host and/or can select buses 342-1, . . . , 342-8 when transferring data to/from memory device 320-1, . . . , 320-8 via controller 314. Data buffers 332-1, . . . , 332-8 can be include SRAM, SDRAM, and/or DRAM arrays. Data buffers 332-1, . . . , 332-8 can be coupled to memory devices 330-1, . . . 330-8 such that all of the DQ pins of memory devices 330-1, . . . 330-8 are coupled to data buffers 332-1, . . . , 332-8, therefore memory devices 330-1, . . . 330-8 can have any type of input/output configuration (e.g., ×4, ×8, and/or ×16, among others, for example) and/or any number of ranks. Also, memory devices 330-1, . . . 330-8 do not include DQ pins that are dedicated to transferring data to memory devices 320-1, . . . 320-8, as buffers 332-1, . . . , 332-8 use sideband buses 342-1, . . . , 342-8 for such transfers. Sideband buses 342-1, . . . , 342-8 can operate by transferring data serially at a speed that allows memory devices 330-1, . . . 330-8 to operate at full speed without being slowed due to any latency associated with buffers 332-1, . . . , 332-8, controller 314, and/or the memory devices 320-1, . . . 320-8).

DIMM 310 can include a second number of memory devices 320-1, . . . , 320-8. For example, memory devices 320-1, . . . , 320-8 can be 3D XPoint memory devices, among other types of volatile and/or non-volatile memory. Memory devices 320-1, . . . , 320-8 can be configured to be a backing store for memory devices 330-1, . . . , 330-8. Controller can be configured to periodically and/or as part of a power down operation transfer data from memory devices 330-1, . . . , 330-8 to memory devices 320-1, . . . , 320-8.

DIMM 310 can be configured to execute commands sent from a host to DIMM 310 by sending command/address information from a host controller (e.g., host controller 108 in FIG. 1) on command/address bus 362 to the register clock driver (RCD) 360 and data on data buses 340-1, . . . , 340-8. The commands from the host can include address information for memory devices 330-1, . . . 330-8 where the host is requesting an operation on data at a particular location in memory devices 330-1, . . . 330-8.

In a number of embodiments, memory devices 330-1, . . . , 330-8 can be configured as cache. For example, memory devices can be configured as cache for the data stored in memory devices 320-1, . . . , 320-8 and/or other memory devices coupled to the computing system. The DIMM 310 can be configured to have a portion of memory devices 330-1, . . . 330-8 addressable by a host and a portion of the memory devices 330-1, . . . 330-8 configured as cache.

In a number of embodiments, commands can be received from a host and/or generated by controller 314 to transfer data between a host and memory devices 330-1, . . . , 330-8, to transfer data between a host and memory devices 320-1, . . . , 320-8, and/or to transfer data between memory devices 330-1, . . . , 330-8 and memory devices 320-1, . . . , 320-8. Data can be transferred between memory devices 330-1, . . . , 330-8 and memory devices 320-1, . . . , 320-8 via buffers 332-1, . . . , 332-8, sideband buses 342-1, . . . , 342-8, controller 314, and buses 346-1 and 346-2. Data can be transferred between a host and memory devices 320-1, . . . , 320-8 via data buses 340-1, . . . , 340-8, buffers 332-1, . . . , 332-8, sideband buses 342-1, . . . , 342-8, controller 314, and buses 346-1 and 346-2.

Commands can be generated by controller 314 to transfer data from memory devices 330-1, . . . , 330-8 to memory devices 320-1, . . . , 320-8. The commands can be sent by controller to register clock driver (RCD) 360 via bus 364 indicating which memory device of memory devices 330-1, . . . , 330-8 will execute the command. The signal can be sent from RCD 360 on buses 366-1 and 366-2 to the memory device of memory devices 330-1, . . . , 330-8 that will execute the command. For example, if the command is transferring data from memory device 330-1 to memory device 320-1, the signal can indicate to multiplexor 348-1 to couple bus 342-1 to buffer 332-1. The command can be executed by transferring data from memory device 330-1 to buffer 332-1 on bus 344-1, from buffer 332-1 to controller 314 on bus 342-1, and from controller 314 to memory device 320-1 via bus 346-1.

Commands can be generated by controller 314 to transfer data from memory devices 320-1, . . . , 320-8 to memory devices 330-1, . . . , 330-8. The commands can be sent by controller to register clock driver (RCD) 360 via bus 364 indicating which memory device of memory devices 330-1, . . . , 330-8 will execute the command and receive data from memory device 320-1, . . . , 320-8. The signal can be sent from RCD 360 on buses 366-1 and 366-2 to the memory device of memory devices 330-1, . . . , 330-8 that will execute the command. For example, if the command is transferring data from memory device 320-1 to memory device 330-1, the signal can indicate to multiplexor 348-1 to couple bus 342-1 to buffer 332-1. The command can be executed by transferring data from memory device 320-1 to controller 314 on bus 346-1, from controller 314 to buffer 332-1 on bus 342-1, and from buffer 332-1 to memory device 330-1 on bus 344-1.

Figure 4:
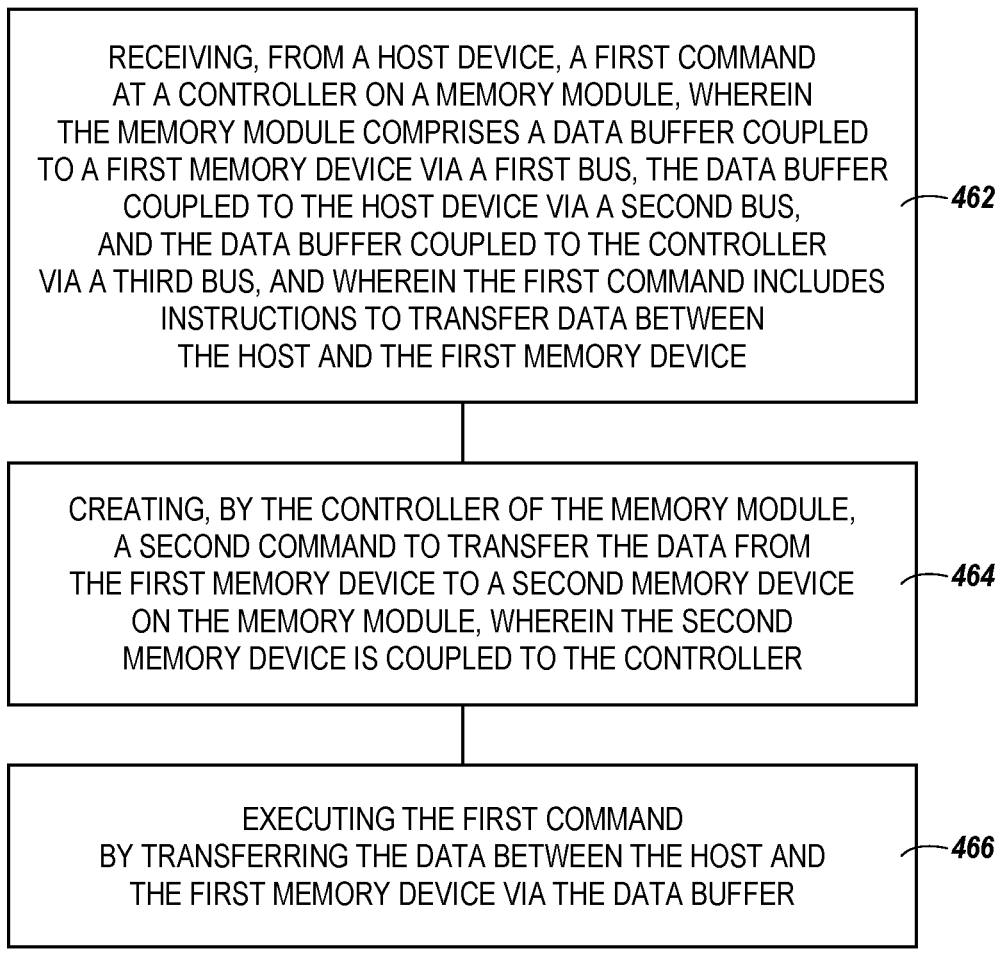
FIG. 4 is a flow diagram illustrating an example data transfer in memory process in accordance with a number of embodiments of the present disclosure.

FIG. 4 is a flow diagram illustrating an example data transfer in memory process in accordance with a number of embodiments of the present disclosure. The process described in FIG. 4 can be performed by, for example, a memory system including a NVDIMM such as DIMM 310 shown in FIG. 3.

At block 462, the method can include receiving, from a host device, a first command at a controller on a memory module, wherein the memory module comprises a data buffer coupled to a first memory device via a first bus, the data buffer coupled to the host device via a second bus, and the data buffer coupled to the controller via a third bus, and wherein the first command includes instructions to transfer data between the host and the first memory device.

At block 464, the method can include creating, by the controller of the memory module, a second command to transfer the data from the first memory device to a second memory device on the memory module, wherein the second memory device is coupled to the controller.

At block 466, the method can include executing the first command by transferring the data between the host and the first memory device via the data buffer.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a data buffer couplable to a host;
    a first memory device coupled to the data buffer via a first bus, wherein all DQ pins of the first memory device are coupled to the data buffer via the first bus;
    a second memory device; and
    a controller coupled to the data buffer via a second bus and configured to cause;
        a first data transfer from first memory device to the second memory device via the data buffer and the second bus in response to receiving a first command from the host via a register clock driver (RCD), wherein the controller generates a second command to cause the first data transfer from the first memory device to the second memory device in response to receiving the first command from the host, wherein the controller sends the second command to the first memory device via the RCD, wherein the second bus is a sideband bus configured for serialized data transfers, and wherein the controller is configured to cause a second data transfer from the host to the second memory device via the data buffer and the second bus, wherein the second bus couples the data buffer to the controller; and
        a third data transfer from the first memory device to the host via the data buffer and the first bus in response to receiving a third command from the host via the RCD, wherein the controller generates a fourth command to transfer data between the first memory device and the host in response to receiving the third command from the host and wherein the controller sends the fourth command to the first memory device.

2. The apparatus of claim 1, wherein the data buffer includes a multiplexor configured to select a third bus to transfer data from the host to the first memory device.

3. The apparatus of claim 1, wherein the data buffer includes a multiplexor configured to select the second bus to transfer data from the first memory device to the second memory device.

4. The apparatus of claim 1, wherein the data buffer includes a static random access memory (SRAM) array.

5. The apparatus of claim 1, wherein the apparatus is a non-volatile dual in-line memory module (NVDIMM), the first memory device is a volatile memory device, and the second memory device is a non-volatile memory device.

6. The apparatus of claim 1, wherein the second memory device is a non-volatile memory device configured to store data from the first memory device during a catastrophic save operation.

7. An apparatus, comprising:
    memory module, wherein the memory module includes a first memory device coupled to a data buffer via a first bus, the data buffer coupled to a controller via a second bus, and a second memory device coupled to the controller, wherein the memory module is coupled to a host, and wherein the memory module is configured to:
        receive a first number of commands to transfer data between the first memory device and the host via the data buffer, wherein the first number of commands are received by the controller from the host via a register clock driver (RCD), wherein the controller generates a second number of commands to transfer data between the first memory device and the host in response to receiving the first number of commands from the host, wherein the controller sends the second number of commands to the first memory device via the RCD, and wherein all DQ pins on the first memory device are coupled to the data buffer; and
        receive a third number of commands to transfer data between the first memory device and the second memory device via the data buffer, wherein the data buffer is coupled to the controller via the second bus that is a sideband bus configured for serialized data transfers; and
        receive a fourth number of commands to transfer data between the host and the second memory device via the data buffer and the second bus.

8. The apparatus of claim 7, wherein the data buffer is coupled to the host via a third bus.

9. The apparatus of claim 8, wherein all the DQ pins of the first memory device are coupled to the first bus.

10. An apparatus, comprising:
    a register clock driver (RCD);
    a controller coupled to the RCD and configured to received commands from a host via the RCD;
    a first number of memory devices coupled to the controller via the RCD and via a number of data buffers; and
    a second number of memory devices coupled to the controller, wherein the number of data buffers each include a multiplexor configured to select a first bus to transfer data between the number of data buffers and the host and configured to select a second bus to transfer data between the number of data buffers and the controller, wherein the controller is configured to receive a first command from the host via the RCD to transfer data between the host and the first number of memory devices, wherein the controller generates a second command to cause data transfer between the host and the first number of memory devices in response to receiving the first command from the host, and wherein the second command is sent from the controller to the first number of memory devices via the RCD and is executed by transferring data between the host and the first number of memory devices via the number of data buffers.

11. The apparatus of claim 10, wherein the controller is configured to send a third command to the first number of memory devices via the RCD to transfer data between the first number of memory devices and the second number of memory devices.

12. The apparatus of claim 11, wherein the third command is executed by transferring data between the first number of memory devices and the second number of memory devices via the number of data buffers.

13. The apparatus of claim 11, wherein the third command is executed by transferring data from the first number of memory devices to the number of data buffers, from the number of data buffers to the controller on the second bus, and from the controller to the second number of memory devices.

14. The apparatus of claim 10, wherein the first bus is a data bus coupled to the host and the second bus is a sideband bus coupled to the controller.

15. A method, comprising:
receiving, from a host device, a first command at a controller on a memory module via a register clock driver (RCD), wherein the memory module comprises a data buffer coupled to a first memory device via a first bus, the data buffer coupled to the host device via a second bus, and the data buffer coupled to the controller via a third bus, and wherein the first command includes instructions to transfer data between the host and the first memory device;

creating, by the controller of the memory module, a second command to transfer the data between the host and the first memory device in response to receiving the first command;

creating, by the controller of the memory module, a third command to transfer the data from the first memory device to a second memory device on the memory module, wherein the second memory device is coupled to the controller;

sending the second command and the third command to the first memory device via the RCD;

executing the second command by transferring the data between the host and the first memory device via the data buffer, wherein all DQ pins on the first memory device are coupled to the data buffer via the first bus;

executing the third command by transferring the data from the first memory device to the data buffer, transferring the data from the data buffer to the controller via the third bus, wherein the third bus is configured to transfer serialized data, and transferring the data from the controller to the second memory device;

receiving, from the host device, a fourth command at the controller on the memory module via the RCD, wherein the fourth command includes instructions to transfer additional data between the host and the second memory device; and executing the fourth command by transferring the additional data between the host and the second memory device via the data buffer and the third bus.

16. The method of claim 15, wherein executing the third command includes selecting the third bus, via a multiplexor on the data buffer, to transfer the data from the data buffer to the controller.

17. The method of claim 15, wherein executing the second command includes selecting the first bus, via a multiplexor on the data buffer, to transfer the data between the host and the data buffer.

18. The method of claim 15, further comprising executing the third command in response to completing execution of the second command to back up the data transferred by the second command.

* * * * *